(12) United States Patent
Butts et al.

(10) Patent No.: US 7,071,690 B2
(45) Date of Patent: Jul. 4, 2006

(54) REDUCTION OF BLURRING IN VIEW ANGLE TILTING MRI

(75) Inventors: Kim Butts, Redwood City, CA (US); John M. Pauly, Redwood City, CA (US)

(73) Assignee: The Board of Trustees of the Leland Stanford Junior University, Palo Alto, CA (US)

( * ) Notice: Subject to any disclaimer, the term of this patent is extended or adjusted under 35 U.S.C. 154(b) by 0 days.

(21) Appl. No.: 10/996,965

(22) Filed: Nov. 23, 2004

(65) Prior Publication Data

US 2006/0109004 A1 May 25, 2006

(51) Int. Cl.
*G01V 3/00* (2006.01)

(52) U.S. Cl. ...................... 324/309; 324/307
(58) Field of Classification Search ............... 324/307, 324/309, 300, 318, 319; 600/410
See application file for complete search history.

(56) References Cited

U.S. PATENT DOCUMENTS

| | | | | |
|---|---|---|---|---|
| 6,150,815 A | * | 11/2000 | Janzen et al. ............. | 324/309 |
| 6,256,526 B1 | * | 7/2001 | Butts et al. ............... | 600/410 |
| 6,424,152 B1 | * | 7/2002 | Prins et al. ............... | 324/307 |
| 6,678,544 B1 | * | 1/2004 | Butts et al. ............... | 600/410 |
| 6,801,647 B1 | * | 10/2004 | Arakawa ................... | 382/132 |

OTHER PUBLICATIONS

Butts et al., "Reduction of Blurring in View Angle Titling MRI with Multiple View Angle Tilting," Unpublished, Submitted to the ISMRM on Feb. 5, 2004.
Butts et al., "Management of Biopsy Needle Artifacts: Techniques for RF refocused MRI,"Journal of Magnetic Resonance Imaging, 9:586-595 (1999).
Cho et al., "Total Inhomogeneity Correction Including Chemical Shifts and Susceptibility by View Angle Tilting,"Med. Phys. 15(1), Jan./Feb. 1988.

* cited by examiner

Primary Examiner—Brij B. Shrivastav
(74) Attorney, Agent, or Firm—Beyer Weaver & Thomas LLP

(57) ABSTRACT

Magnetic resonance imaging utilizes view angle tilting to correct for in-plane distortions with each RF excitation pulse being followed by a plurality of signal readouts to reduce image blurring. Each image readout is in the presence of a frequency select gradient ($G_x$) and a slice select gradient ($G_z$), and at least the slice select gradient is refocused after each readout of an image signal. Each readout can have a time duration of the main lobe of the RF excitation pulse or the readout can have a higher bandwidth with an increased number of readouts. The combining of multiple readouts diminishes slice profile modulation resulting from Fourier transform.

20 Claims, 9 Drawing Sheets

(a)          (b)

REDUCTION OF BLURRING IN VIEW ANGLE TILTING MRI

GOVERNMENT RIGHTS

The U.S. government has rights in the disclosed invention pursuant to NIH grants to Stanford University including NIH-R2977677.

BACKGROUND OF THE INVENTION

This invention relates generally to magnetic resonance imaging (MRI), and more particularly the invention relates to the use of view angle tilting (VAT) readout for reducing MRI signal distortion from an object in the presence of magnetic field inhomogeneity including inhomogeneity due to the presence of metal in the object.

Magnetic resonance imaging (MRI) is a non-destructive method for the analysis of materials and for medical imaging. It is generally non-invasive and does not involve ionizing radiation. In very general terms, nuclear magnetic moments are excited at specific spin precession frequencies which are proportional to the local magnetic field. the radio frequency signals resulting from the precession of the spins are received using pickup coils. By manipulating the magnetic fields, an array of signals is provided representing different regions of the volume. These are then combined to produce a volumetric image of the nuclear spin density of the body.

MRI signals for recording an image of an object are obtained by placing the object in a magnetic field, applying magnetic gradients for slice selection, applying a magnetic excitation pulse to tilt nuclei spins in the desired slice, and then detecting MRI signals emitted from the tilted nuclei spins.

The use of view angle tilting to reduce adverse imaging effects from magnetic field inhomogeneities is described by Cho et al. in "Total Inhomogeneity Correction Including Chemical Shifts and Susceptibility by View Angle Tilting" Med. Phys. 15(1), January/February 1988. The method uses a gradient applied on the slice select axis during readout, with an amplitude equal to that of the slice select gradient. The slice is then effectively viewed at an angle $\theta = \tan^{-1}(G_z/G_x)$. When viewed at this angle, shifts in the slice selection plane compensate for shifts during readout, such that in-plane shifts are re-registered in the images.

The VAT technique has been employed also to improve depiction of biopsy needles in RF refocused MRI. See Butts et al. "Management of Biopsy Needle Artifacts: Techniques for RF refocused MRI", Journal of Magnetic Resonance Imaging, 9:586–595 (1999).

However, view angle tilting images have suffered from an apparent blurring in the frequency encode direction that has hindered the widespread use of the technique. Typical spin echo and view angle tilting images are shown in FIG. 1. The arrowhead appearance of the needle artifact is eliminated with view angle tilting, but the VAT image suffers from blurring in the frequency encoding direction.

One possible cause of the blurring with VAT MRI is due to viewing the slice at an angle. This is because edges that are oriented exactly through-plane suffer from partial voluming effects when viewed at an angle.

SUMMARY OF THE INVENTION

We have discovered that a major source of blurring with view angle tilting is due to slice profile modulation and particularly the effects of k-space traversal during readout and the modulation of image data by the Fourier transform of the image slice profile.

In accordance with the invention, the modulation effects in a VAT MRI are reduced by obtaining a plurality of gradient echoes in a VAT imaging sequence which includes refocusing of the slice select gradient after the initial readout. In an echo planar VAT sequence only the slice select ($G_Z$) is refocused, while in a flyback VAT sequence gradients are refocused in both frequency ($G_X$) and slice select ($G_Z$) directions. The multiple readout data are then combined.

In a preferred embodiment a quadratic RF pulse is used for slice excitation to reduce signal drop off due to amplitude modulation of the readout signal. Each readout is matched in duration to the main lobe of the RF pulse. Bandwidth of the readout can be increased to improve image fidelity, but the number of readouts must be increased to maintain signal to noise ratio (SNR).

The invention and objects and features thereof will be more readily apparent from the following detailed description and appended claims when taken with the drawings.

DETAILED DESCRIPTION

As noted above, magnetic resonance imaging in the presence of metal such as metallic prostheses, pins, screws, and interventional devices have warping during slice selection and distorts during frequency encoding. Distortions in the frequency encoding direction can be reduced by increasing the receive bandwidth, at a cost in signal-to-noise ratio. View angle tilting (VAT) has also been proposed for reducing metal artifacts around prostheses and interventional devices such as needles and cryoprobes.

In verifying the invention, two sets of experiments have been conducted. In a first set of experiments, the blurring from slice profile modulation was identified. In a second set of experiments, several pulse sequences that match readout duration to the width of the main lobe of the RF pulse are designed which have multiple gradient echo readout. The multiple readouts are combined to produce VAT images with reduced blurring.

In the first set of experiments, a spin echo pulse sequence was used with the following parameters: TE/TR of 20/500, sampling bandwidth ±16 kHz, slice thickness 5 mm, field of view 24 cm. The phantom consisted of a gel phantom with gel inclusions, and a cup of gadolinium doped water into which two needles were inserted, an 18 gauge EZEM Inconel needle and a 14 gauge solid Inconel needle shaft, both oriented perpendicular to $B_0$. Imaging was performed on a 0.5T Signa SP MRI scanner.

Figure 1:
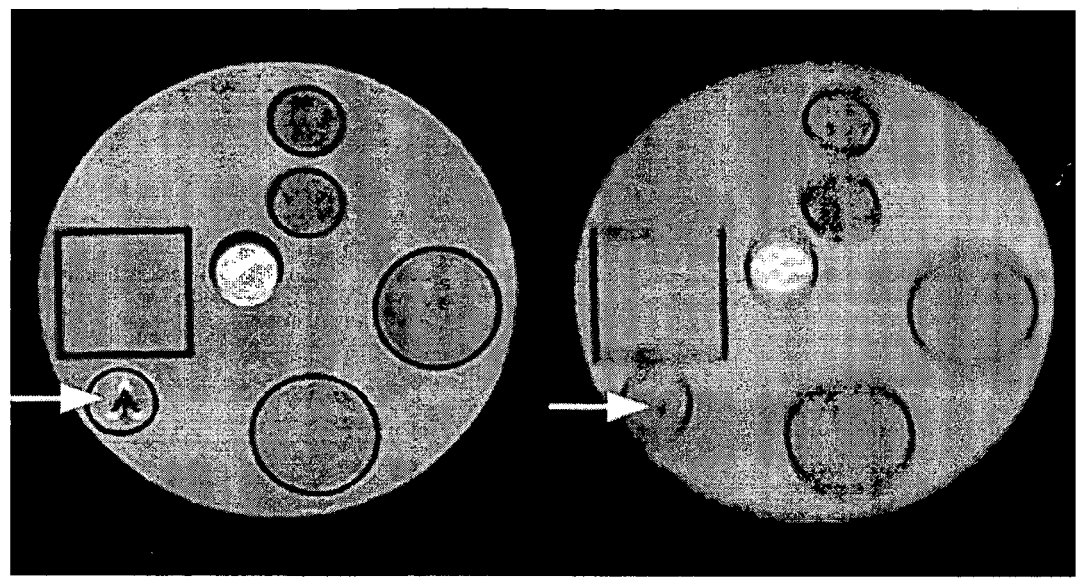
FIGS. 1a, 1b are respectively spin echo and view angle tilting images which demonstrate the reduction in susceptibility artifacts from a biopsy needle, but with attendant blurring in the view angle tilting image.
Figure 2:
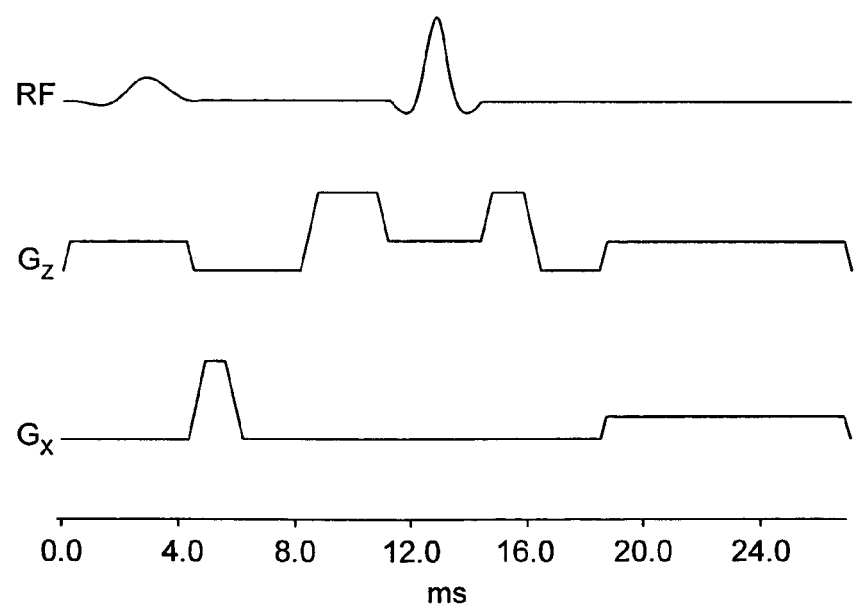
FIG. 2 is a view angle tilting pulse sequence.

Three sets of images were acquired as follows. The first set were conventional spin echo images. The second set were acquired with a view angle tilting sequence shown in FIG. 2, at a view angle of 44°. The third set used a specially designed quadratic phase RF pulse for the excitation pulse, in the place of the default minimum phase excitation pulse, which resulted in a view angle of 48°. All three sets of images were also acquired with the readout and phase encoding gradients turned off.

Figure 3:
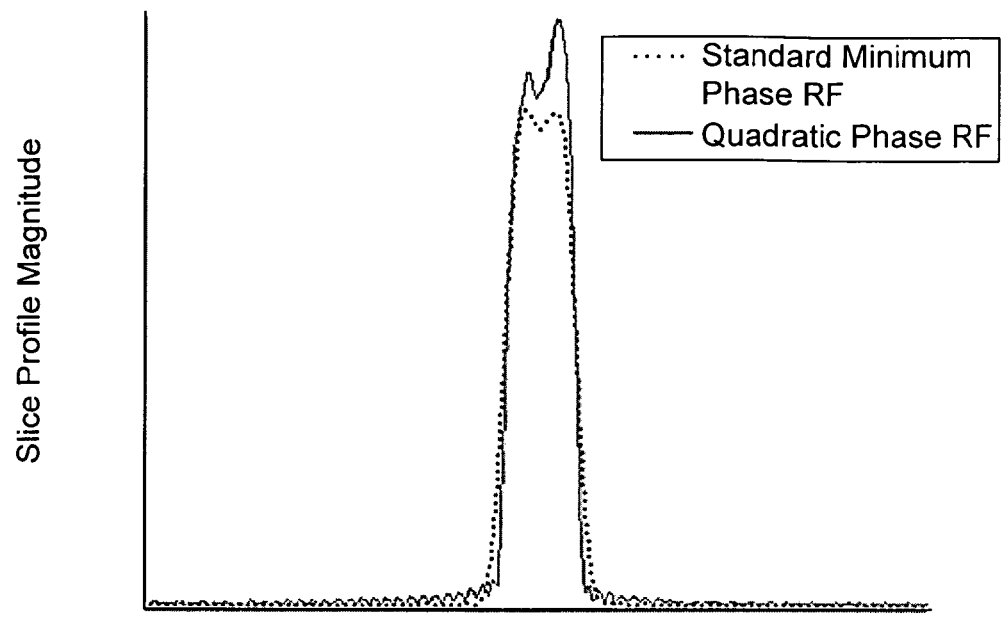
FIG. 3 is a plot of simulated slice profiles using a default minimum phase RF pulse and a quadratic phase pulse.
Figure 4:
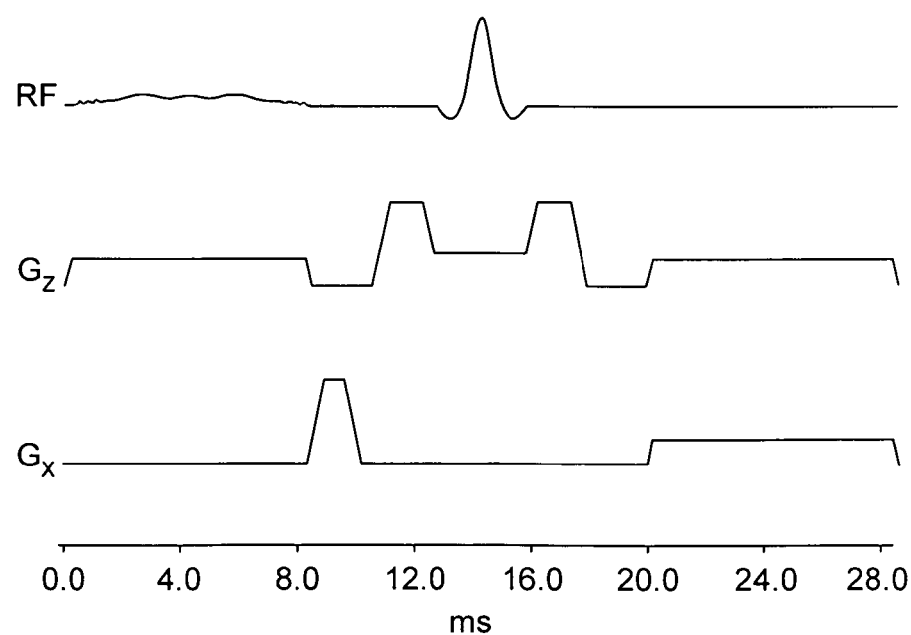
FIG. 4 is a view angle tilting pulse sequence similar to the sequence of FIG. 2 but with a different view angle.

The purpose of using this special RF pulse was to demonstrate that with a pulse of duration equal to the readout duration, of positive amplitude throughout, and without a reduction in receive bandwidth (i.e., same view angle), that the blurring would be reduced in VAT MRI. To do this, we designed an equiripple pulse of duration 8 ms and time-bandwidth product of 6. The pulse was optimized with zero flipping to maximize the minimum signal. This is similar to the method described by Pauly and Wong at ISMR 2001 in which RF pulses can be optimized by zero flipping to minimize the maximum signal. For this pulse, there were $2^6$ possibilities that were individually inspected. The pulse chosen had a bandwidth of 750 Hz, similar to the 886 Hz bandwidth of the minimum phase pulse that was default in the sequence. The simulated slice profiles of the default and quadratic phase pulses shown in FIG. 3 demonstrate similar profiles. The pulse sequence using this RF pulse is shown in FIG. 4. Note the amplitude of the gradient on the slice select axis during the readout is of similar amplitude to that shown in FIG. 2, indicating similar view angles.

The data acquired with the quadratic phase pulse had a quadratic phase across the slice. Since the application of the view angle tilt gradient results in a modulation by the transform of the slice profile, this quadratic phase was removed from the data in both acquisitions in a post processing step. The signal modulations were found from the data with the phase and frequency encoding gradients turned off. These modulations were normalized by the values at the middle of the echo.

In the second set of experiments, we designed two possible pulse sequences that match the readout duration to the width of the main lobe of the RF pulse. However, simply increasing the receive bandwidth inefficiently uses the transverse magnetization and results in a loss of SNR. Thus, we designed two sequences that efficiently measure the transverse magnetization, while still matching each readout duration to the width of the main lobe of the RF pulse.

Figure 5:
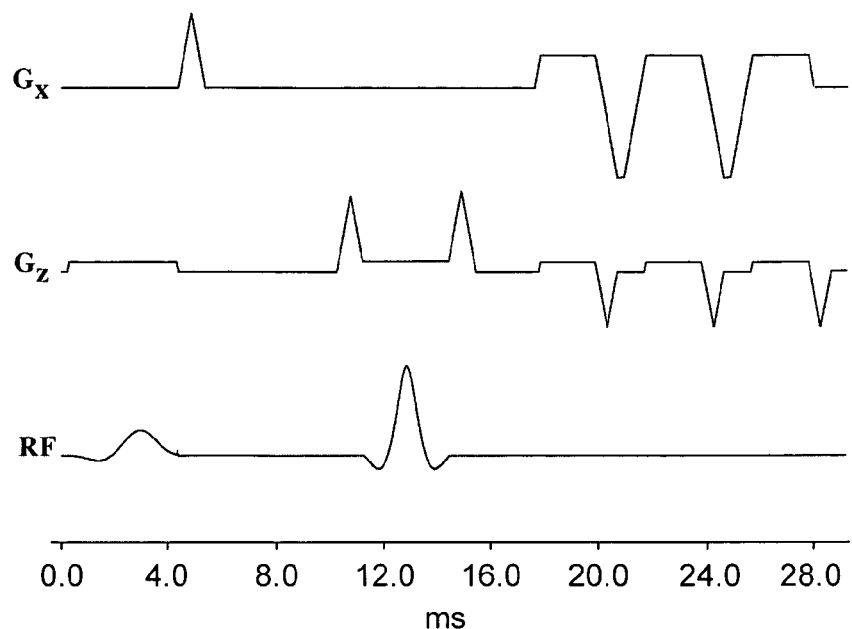
FIG. 5 is a view angle tilting spin echo pulse sequence in accordance with an embodiment of the present invention in which gradients in both X and Z are refocused in a flyback mode.
Figure 6:
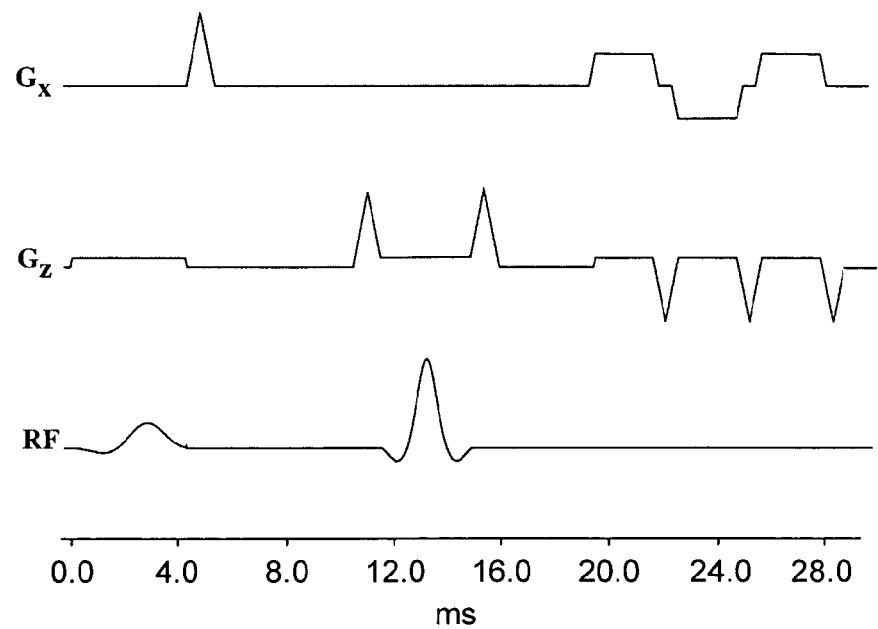
FIG. 6 is a view angle tilting spin echo pulse sequence in accordance with another embodiment of the invention in which only the Z gradient is refocused with readout in an echo planar mode.

The first sequence shown in FIG. 5 using a receive bandwidth of ±64 kHz and refocuses the gradients in both the frequency and slice select directions in a "flyback" trajectory. The second sequence shown in FIG. 6 similarly acquires three echoes centered around the spin echo, but refocuses only the slice select gradient. For this sequence, the echoes are read out under alternating polarity of the readout gradient, in an echo planar trajectory. Depending on the exact field of view, slice thickness, and slew rate used, the time for refocusing the gradients can insert 1–2 ms between the echoes. With each readout of 2 ms each and the additional time between the readouts, 8–10 ms is required. Thus, comparisons are drawn between images using a combination of the three 2-ms readouts and images made from a single 8 ms readout.

Images were acquired of a gel phantom with gel inclusions, oil inclusion, and a needle (EZEM 22 g MRI-compatible biopsy needle with obturator) imbedded into the gel. For this set of experiments, imaging was performed on a 1.5T GE Signa scanner. Other imaging parameters included a TE/TR of 20/500, slice thickness 5 mm, field of view 24 cm. Conventional spin echo image with similar parameters and bandwidths of ±16 and ±64 kHz were also acquired. Similar images were also acquired of a hip prosthesis embedded in a gel phantom, with both gel and oil inclusions.

The three VAT images acquired each acquisition were combined in Matlab with the following algorithm: first, the difference between the spin echo image and the first image was obtained. In pixels where this value was positive (i.e. $T2^* \gg T2$), the value was then added to the first and third images, followed by a sum of squares operation performed on all three images. In pixels where $T2^*$ is essentially the same as T2, the algorithm is equivalent to a straightforward sum-of-squares operation.

Signal to noise (SNR) measurements were made in five locations in the gel phantom in conventional spin echo images acquired at ±16 kHz and ±64 kHz, view angle tilting with a single ±16 kHz readout, and view angle tilting images with multiple ±64 kHz readouts. The multiple-readout view angle tilting measurements were made on images using both combination schemes. Each of the five measurements on a single image were averaged.

Figure 7:
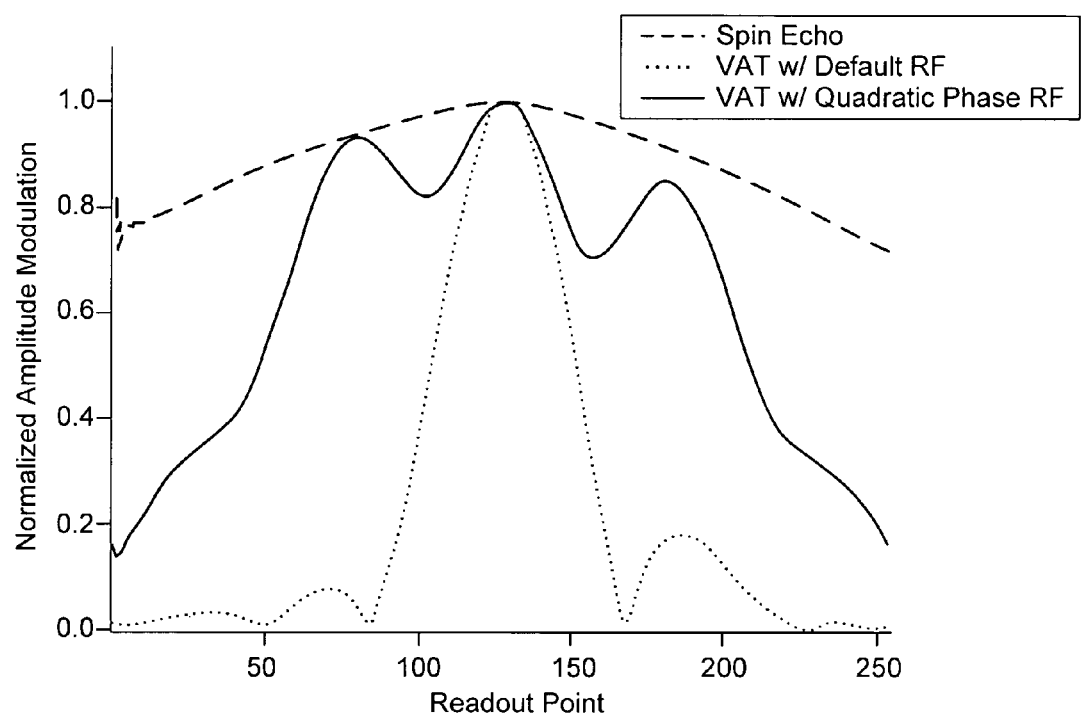
FIG. 7 is a plot of readouts from spin echo, VAT with default RF, and VAT with quadratic phase RF and illustrating the low pass filtering effect on the VAT data.

From the first set of experiments the three modulations found from the acquisitions with the phase encode and readout gradients turned off is shown in FIG. 7. The spin echo modulation is slowly varying and decreases to approximately 75% of the spin echo amplitude at the edges of the readout. However, the VAT modulation with the default RF pulse rapidly decreases to zero, with low amplitude sidelobes. The VAT sequence with the optimized RF pulse decreases to approximately 18% of the maximum signal, but does so only at the edges of the readout, effectively reducing the low pass filtering of the data demonstrated by the VAT data obtained with the default minimum phase RF pulse.

Figure 8:
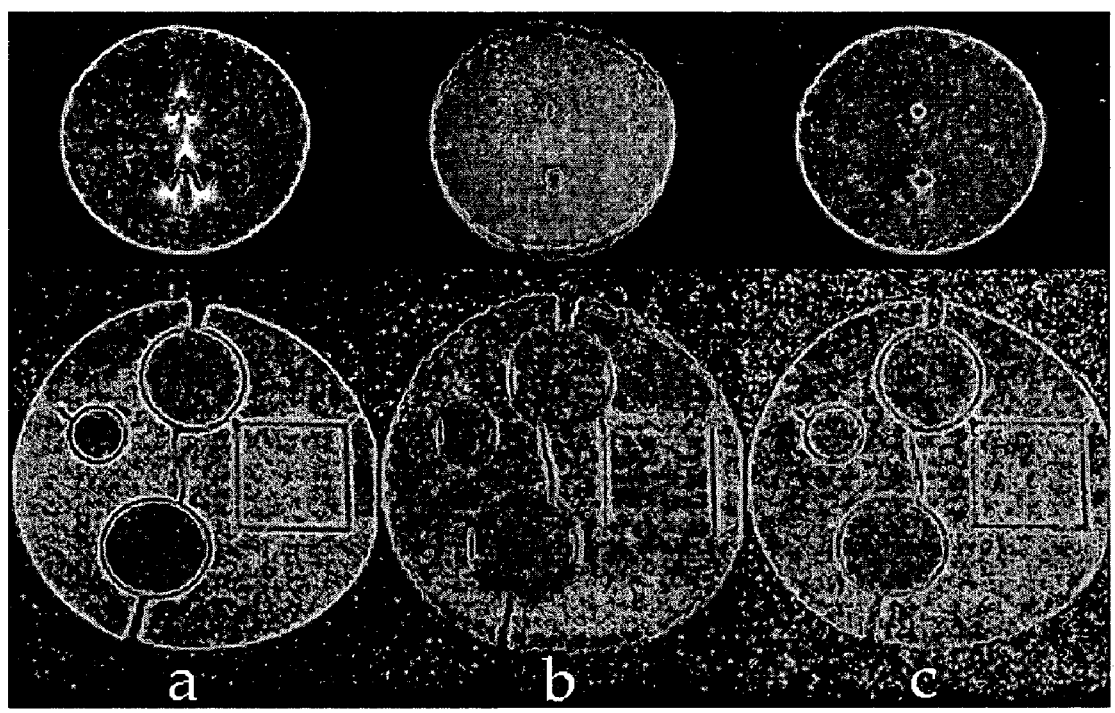
FIGS. 8a–8c illustrate respectively images using conventional spin echo, view angle tilting with default minimum phase RF, and view angle tilting with quadratic phase RF and demonstrating the reduction in blurring with the quadratic phase RF pulse.

Images acquired with these three sequences are shown in FIG. 8. While the images in b and c have similar view angles of 44° and 48°, respectively, the image acquired with the quadratic phase RF pulse demonstrates higher resolution than the image in b. These results demonstrate the need to match the readout duration to the main lobe of the excitation pulse.

Figure 9:
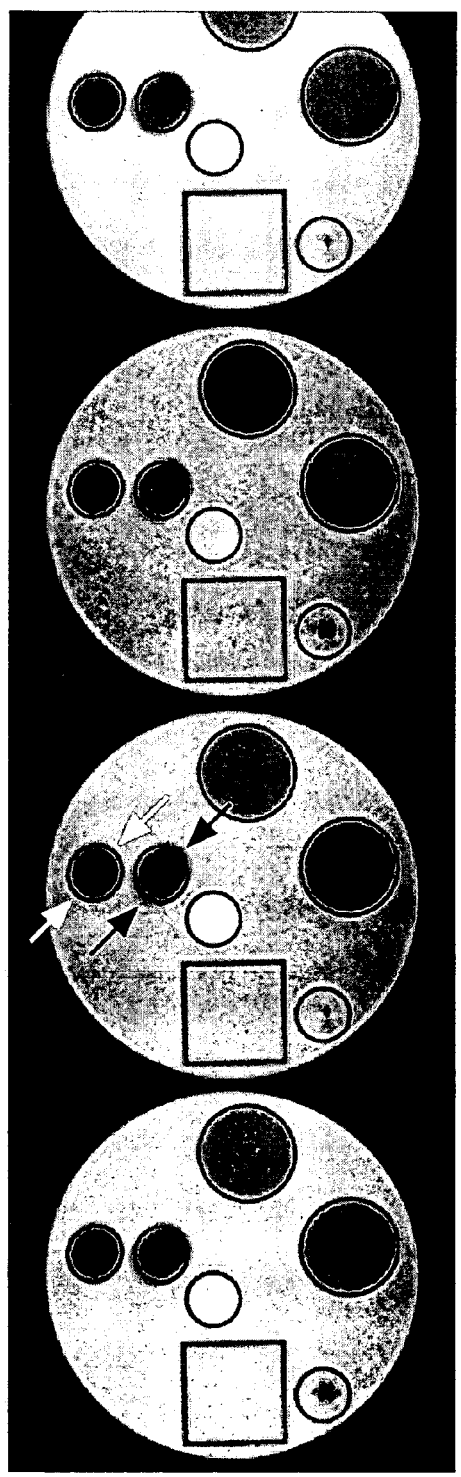
FIGS. 9a–9d are images illustrating flyback VAT imaging (a–c) and a combination of the three images (d).
Figure 10:
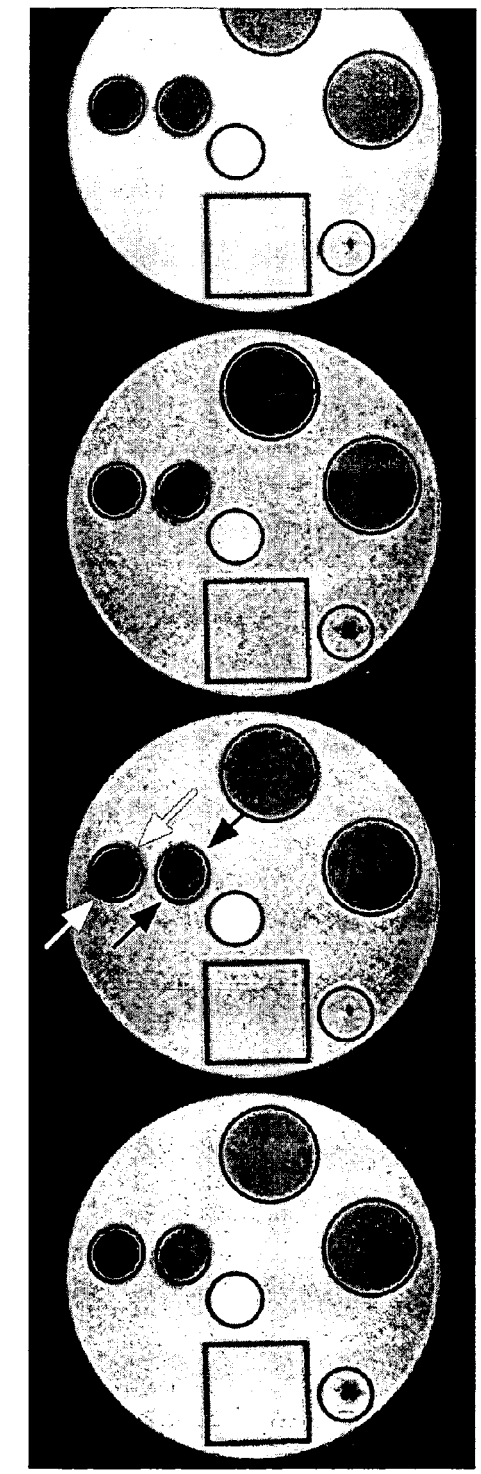
FIGS. 10a–10d are individual echo planar VAT images (a–c) and a combination of the three images (d).

From the second set of experiments, images acquired with the flyback VAT sequence and the echo planar VAT sequence are shown in FIGS. 9 and 10. In each figure, the three source images and two combined images are provided. The source images show the loss of signal around the needle for the first and third images (the second image was acquired at the time of the spin echo). The combined images similarly demonstrate minimal distortion of the spins adjacent to the needle, high signal level similar to the spin echo image, and improved signal-to-noise compared to the individual images.

The images in FIGS. 9 and 10 do differ in one important way. In FIG. 9, all three individual images were acquired at the same view angle. This is because the both sets of gradients were refocused for all three readouts. In FIG. 10, the first and third images were acquired at the same view angle as those in FIG. 9. However, the second image in FIG. 10 was acquired with a different view angle. This is because for this image, the readout gradient was of inverted polarity. The appearance of most of the phantom is the same for both view angles. A difference can be seen in the two upper tubes that were oriented obliquely through the phantom (black and white arrows). For the uppermost tube (white arrows), the positive polarity readout is sharper, as seen in FIG. 9b or FIG. 10a. However, for the second highest tube (black arrows), the negative polarity readout is sharper, as seen in FIG. 10b.

The two methods for combining the images provide essentially the same result, as shown in FIGS. 9d and 10d. There is no discernable difference in the results.

Figure 11:
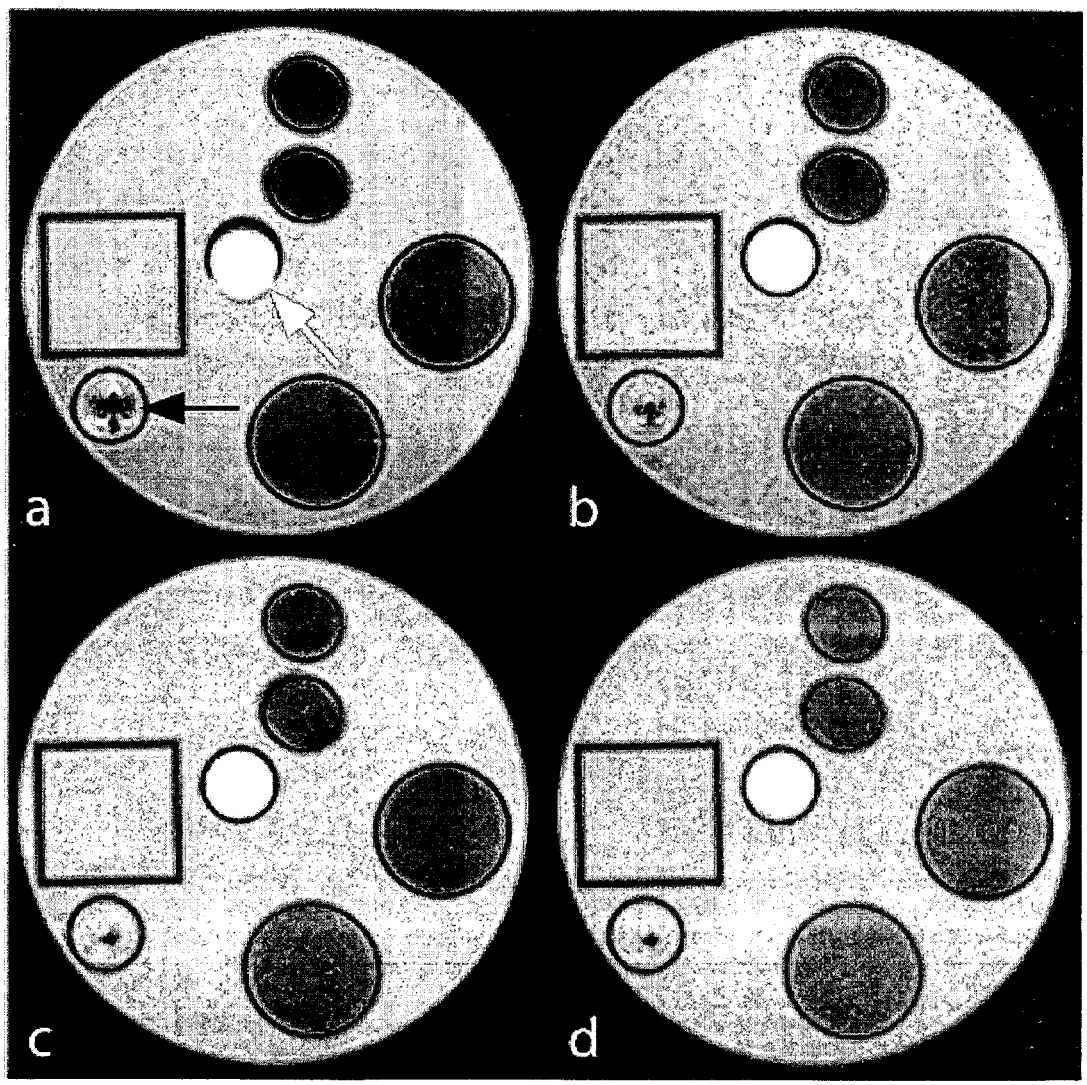
FIGS. 11a–11d are images acquired with conventional spin echo imaging at 16 kHz (a) and at 64 kHz (b), view angle tilting with multiple flyback (c), and echo planar readouts (d).

FIG. 11, is a direct comparison between conventional spin echo images at ±16 kHz (a) and ±64 kHz (b), and view angle tilting images with multiple flyback (c) and echo planar (d) readouts. In both conventional spin echo images (a–b), there is a shift of the lipid signal (white arrow) and arrowhead distortion around the needle (black arrow). In both multiple readout VAT images, the lipid shift and distortion around the needle is eliminated. The two uppermost tubes in the VAT flyback acquisition appear slightly different from the spin echo images due to the view angle. However, these tubes are actually similar to the conventional spin echo images in the echo planar acquisition.

The results of the SNR measurements made in the gel phantom are provided in Table 1. On average, the multiple readout VAT images have approximately 90% of the SNR of the original conventional spin echo image. There is little difference in SNR between the two combination methods.

TABLE 1

| Scan Description | SNR |
|---|---|
| Conventional Ship Echo, BW =± 16 kHz | 47.6 |
| Conventional Ship Echo, BW =± 64 kHz | 27.5 |
| Single readout VAT, BW =± 16 | 48.4 |
| Multiple readout VAT, Flyback Trajectory | 42.8 |
| Multiple readout VAT, EPI Trajectory | 42.1 |

Figure 12:
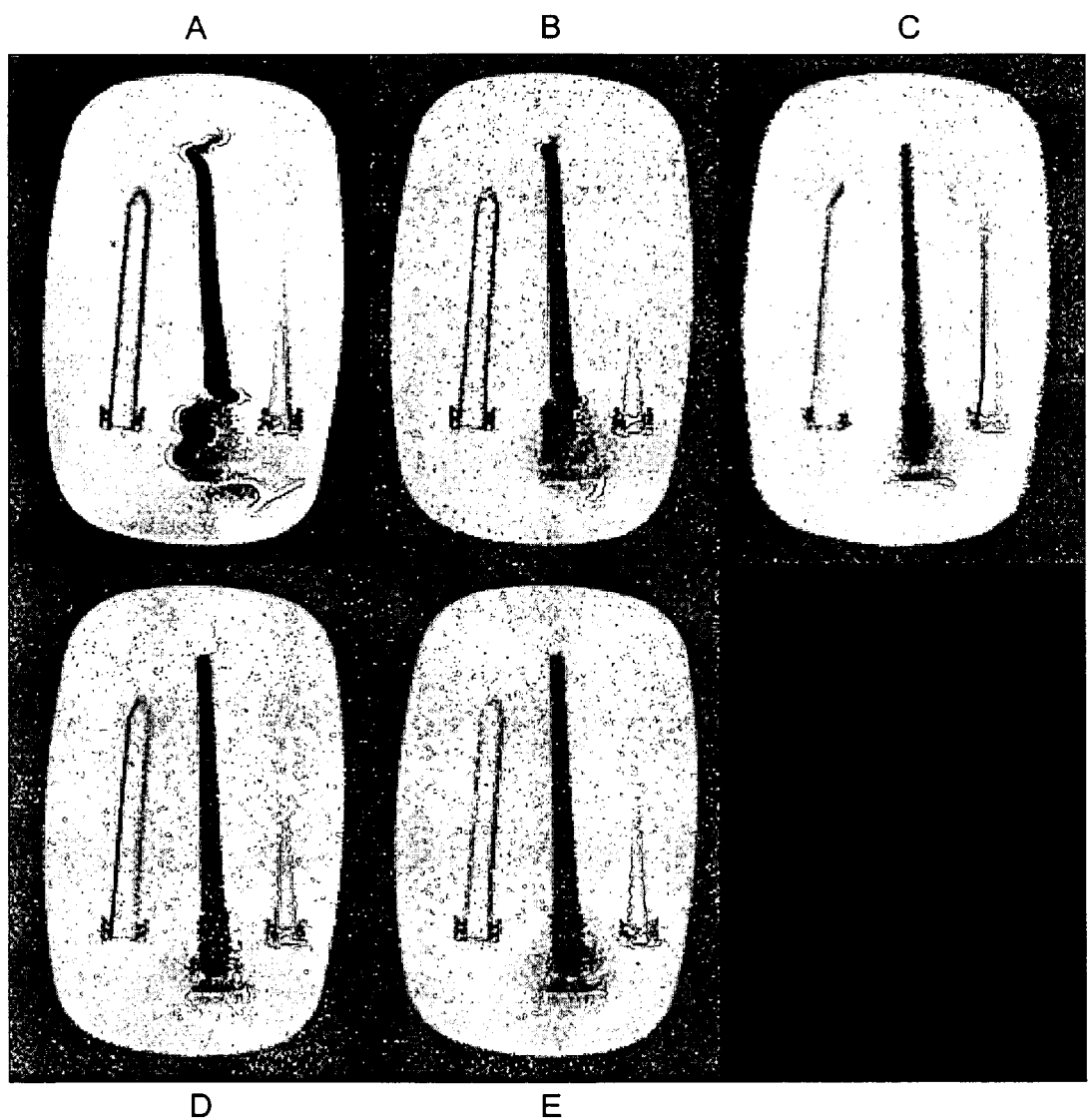
FIGS. 12a–12e are images of a hip prosthesis acquired with conventional spin echo imaging at 16 kHz (a) and at 64 kHz (b), single readout view angle tilting (c) and view angle tilting with multiple flyback (d), and echo planar (e) readouts.

FIG. 12 are similar images of a titanium hip prosthesis. The distortions in the frequency encode direction in the conventional ±16 kHz spin echo image are mitigated with high bandwidth, but eliminated with view angle tilting. The multiple readout VAT images do not have the blurring of the single readout VAT image.

We have found that the source of blurring with view angle tilting is not primarily the view angle. Instead the amplitude modulation by the transform of the slice profile causes an effective low pass filter of the data. The effects of this low pass filter can be diminished by matching the duration of reach readout to the duration of the main lobe of the excitation pulse. This results in a very short readout compared to the RF pulse, a situation which is opposite to the normal situation where the readout is typically longer than the duration of the RF pulse.

This goal of reducing the readout duration to less than that of the main lobe of the RF pulse can be achieved in several ways. First, the BW of the RF pulse can be reduced (i.e. lengthening the duration of the pulse). However, this results in an increased warping of the slice in the presence of field inhomogeneities (potato chipping). Another alternative is to increase the readout bandwidth, with a resulting loss in SNR and inefficient sampling of the available transverse magnetization. A third alternative is the use of a quadratic phase RF pulse similar to that used here. The quadratic phase pulse does result in a loss of SNR due to intravoxel phase dispersion across the slice. Nonetheless, the quadratic phase RF pulse can be used to reduce blurring with view angle tilting when higher gradient strengths are needed than are available. The fourth alternative is the multiple readout scheme described here, where each readout is matched in duration to the main lobe of the RF pulse, and the images are then combined into a single image.

Figure 13:
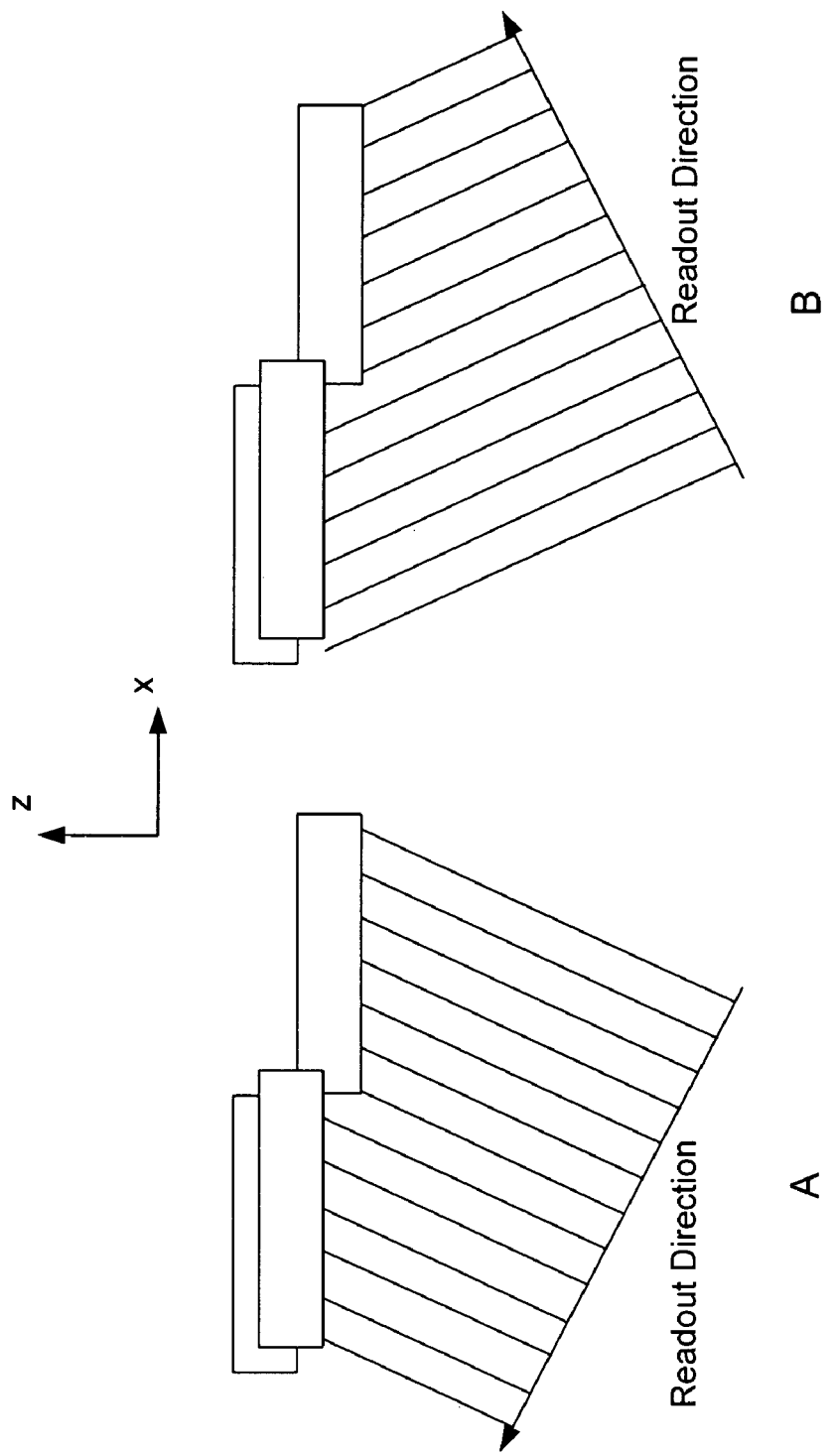
FIGS. 13a, 13b are schematics of view angle tilting for both readout directions used in an echo planar trajectory.

A schematic showing both the positive and negative polarity readouts is shown in FIG. 13 for two spin populations at different resonant frequencies. A shifted slice is excited, as shown by the black bar. Then, depending on the readout direction, the off-resonant spin population is shifted in the frequency encoding direction. Although the readout direction is different in a & b, the view angle compensates for the shift. Inversion of the view angle tilt gradient, however, increases the apparent distortions of off-resonant spins.

There are many possibilities for combining multiple readout images. The one shown here is only an example. With the flyback trajectory, in pixels where T2 decay dominates over T2' decay, the combination reduces to a straightforward sum of squares algorithm. However, the use of this reconstruction with the echo planar trajectory is not quite so straightforward when there are edges oriented obliquely through the scan plane. This is due to the difference in view angle between the second image and the other two. While one view angle may be sharper for some structures than the other view angle, this edge definition can be reduced in the reconstruction process due to the combination of images from both view angles. However, the edge definition of the oblique edges do seem to be more similar to the original spin echo image (FIG. 11 a) with the echo planar trajectory (FIG. 11 d) than the with the flyback trajectory (FIG. 11 c).

The illustrated embodiments demonstrate one possibility for reducing blurring in view angle tilting MRI. Other options may include the use of many readouts of very high bandwidth. For example, instead of 3 readouts of ±64 kHz, five or seven readouts of ±128 kHz could be used. When very high bandwidth readouts are used, the bandwidth of the RF pulse can also be increased, thereby reducing warping of the slice. Nonetheless, care must be taken to ensure that the readout duration is no longer than the main lobe of the RF pulse. The drawbacks of increased RF bandwidth will be increased SAR and potentially increased view angle. This will be most problematic at high field, the situation in which it is most needed. Thus, the optimal combination of RF bandwidth and readout bandwidth is potentially field-strength dependent and/or application dependent.

While the invention has been described with reference to specific embodiments, the description is illustrative of the invention and is not to be construed as limiting the invention. Various modifications and applications may occur to those skilled in the art without departing from the true scope and spirit of the invention as defined by the appended claims.

What is claimed is:

1. A method of magnetic resonance imaging using view angle tilting comprising the steps of:
    (a) placing an object to be imaged in magnetic resonance imaging apparatus,
    (b) applying a RF excitation pulse to the object in the presence of an axial gradient ($G_Z$),
    (c) reading out a plurality of image signals in the presence of a frequency select gradient ($G_X$) and a slice select gradient ($G_Z$), the slice select gradient (Gz) being refocused after each readout of an image signal, each readout having a bandwidth greater than the bandwidth of the RF excitation pulse and the number of readouts per excitation pulse being increased to maintain signal to noise ratio, and
    (d) combining the plurality of image signals.

2. The method of claim 1 wherein step d) uses a sum of squares operation for combining the image signals.

3. The method of claim 1 wherein step c) includes multiple flyback readouts of same polarity.

4. The method of claim 1 wherein step c) includes multiple flyback readouts of alternating polarity.

5. The method of claim 1 wherein the frequency select gradient ($G_X$) is refocused after each readout.

6. The method of claim 5 wherein each readout has the time duration of a main lobe of the RF excitation pulse.

7. The method of claim 6 wherein the RF excitation pulse is a quadratic phase pulse.

8. The method of claim 1 wherein the RF excitation pulse is a quadratic phase pulse.

9. The method of claim 1 wherein each readout has the time duration of a main lobe of the RF excitation pulse.

10. The method of claim 9 wherein the RF excitation pulse is a quadratic phase pulse.

11. In magnetic resonance imaging using view angle tilting comprising signal readout, a method of reducing blurring in a magnetic resonance image comprising the steps of:
    (a) acquiring multiple image readouts after each RF excitation pulse, each readout having a bandwidth greater than the bandwidth of the RF excitation pulse and the number of readouts per excitation pulse is increased to maintain signal to noise ratio, and
    (b) Combining the plurality of image readouts.

12. The method of claim 11 wherein step b) uses a sum of squares operation for combining the image signals.

13. The method of claim 11 wherein step a) includes multiple flyback readouts of same polarity.

14. The method claim 11 wherein the slice select gradient ($G_Z$) is refocused after each readout of an image signal in step a.

15. The method of claim 14 wherein each readout has the time duration of a main lobe of the RF excitation pulse.

16. The method of claim 11 wherein the frequency select gradient ($G_Z$) is refocused after each readout in step a.

17. The method of claim 16 wherein the RF excitation pulse is a quadratic phase pulse.

18. The method of claim 11 wherein the RF excitation pulse is a quadratic phase pulse.

19. The method of claim 11 wherein each readout has the time duration of a main lobe of the RF excitation pulse.

20. The method of claim 19 wherein the RF excitation pulse is a quadratic phase pulse.

* * * * *